United States Patent
Sakai

(10) Patent No.: US 8,721,914 B2
(45) Date of Patent: May 13, 2014

(54) PIEZOELECTRIC ELEMENT, LIQUID EJECTING HEAD, AND LIQUID EJECTING APPARATUS

(75) Inventor: Tomohiro Sakai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/403,097

(22) Filed: Feb. 23, 2012

(65) Prior Publication Data

US 2012/0217430 A1  Aug. 30, 2012

(30) Foreign Application Priority Data

Feb. 24, 2011  (JP) ................................. 2011-039041

(51) Int. Cl.
*H01L 41/18*  (2006.01)
*B41J 2/045*  (2006.01)

(52) U.S. Cl.
USPC .................. 252/62.9 PZ; 252/62.9 R; 347/68

(58) Field of Classification Search
USPC .......................... 347/68; 252/62.9 R, 62.9 PZ
See application file for complete search history.

(56) References Cited

U.S. PATENT DOCUMENTS

| 7,646,140 | B2 * | 1/2010 | Aoki et al. | 310/358 |
| 2009/0230211 | A1 * | 9/2009 | Kobayashi et al. | 239/102.2 |
| 2011/0037812 | A1 * | 2/2011 | Naono et al. | 347/68 |
| 2011/0298336 | A1 * | 12/2011 | Saito et al. | 310/358 |
| 2012/0147100 | A1 * | 6/2012 | Nawano et al. | 347/71 |
| 2012/0200643 | A1 * | 8/2012 | Isshiki | 347/72 |

FOREIGN PATENT DOCUMENTS

| JP | 2001-223404 | 8/2001 |
| JP | 2009-252789 | 10/2009 |

OTHER PUBLICATIONS

Dennis L. Jackson, an Ising-like Model to Predict Dielectric Properties of the Relaxor Ferroelectric Solid Solution BaTiO3—Bi(Zn1/2Ti1/2)O3, Dec. 1, 2011, Introduction, 1.8 BT-BZT, pp. 8-10.*

* cited by examiner

Primary Examiner — Lisa M Solomon
(74) Attorney, Agent, or Firm — Workman Nydegger

(57) ABSTRACT

A piezoelectric element comprises a piezoelectric layer and an electrode provided with the piezoelectric layer. The piezoelectric layer is made of a composite oxide containing bismuth ferrite, barium titanate, and bismuth zinc titanate.

5 Claims, 10 Drawing Sheets

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-039041, filed Feb. 24, 2011 is expressly incorporated by reference.

BACKGROUND

1. Technical Field

The present invention relates to a liquid ejecting head including a piezoelectric element which causes a pressure change in a pressure generation chamber communicating with a nozzle opening and has a piezoelectric layer and an electrode that applies a voltage to the piezoelectric layer, a liquid ejecting apparatus, and the piezoelectric element.

2. Related Art

As a piezoelectric element used in a liquid ejecting head, there is a piezoelectric element configured by interposing a piezoelectric layer made of a piezoelectric material that presents a electromechanical conversion function, for example, a crystallized dielectric material between two electrodes. Such a piezoelectric element is mounted in the liquid ejecting head as, for example, an actuator device in a flexural vibration mode. Here, as a representative example of the liquid ejecting head, for example, there is an ink jet type recording head in which a part of a pressure generation chamber communicating with a nozzle opening that discharges ink droplets is configured as a vibration plate, and the vibration plate is deformed by the piezoelectric element to pressurize ink in the pressure generation chamber, thereby discharging the ink as ink droplets from the nozzle opening.

A piezoelectric ceramic film included in the piezoelectric element requires high piezoelectric characteristics, and as a representative example of the piezoelectric material, there is lead zirconate titanate (PZT) (refer to JP-A-2001-223404). However, since lead zirconate titanate contains lead, from the viewpoint of environmental problems, a piezoelectric material that does not contain lead is required. Consequently, as the piezoelectric material that does not contain lead, for example, piezoelectric materials having a perovskite structure based on bismuth ferrite (based on $BiFeO_3$) containing bismuth and iron are suggested. As a specific example, there is a composite oxide represented as a mixed crystal of bismuth ferrate manganate such as $Bi(Fe,Mn)O_3$ or barium titanate such as $BaTiO_3$ (for example, refer to JP-A-2009-252789).

The bismuth ferrite-based piezoelectric material has a problem in that cracks are more likely to occur, compared to the piezoelectric layer made of the piezoelectric material containing lead. In particular, there are problems in that cracks are more likely to occur when a thick piezoelectric layer (for example, a piezoelectric layer of equal to or greater than 750 nm) is formed and it is difficult to form a thick piezoelectric layer made of a bismuth ferrite-based material.

In addition, of course, such problems occur not only in the ink jet type recording head, but also in other liquid ejecting heads that discharge liquid droplets other than ink, and also occur in piezoelectric elements used for devices other than the liquid ejecting head.

SUMMARY

An advantage of some aspects of the invention is that it provides a liquid ejecting head in which an environmental burden is low and an occurrence of cracks is suppressed, a liquid ejecting apparatus, and a piezoelectric element that provides these.

According to an aspect of the invention, there is provided a liquid ejecting head including: a pressure generation chamber communicating with a nozzle opening; and a piezoelectric element including a piezoelectric layer and an electrode provided on the piezoelectric layer, wherein the piezoelectric layer is made of a composite oxide containing bismuth ferrite, barium titanate, and bismuth zinc titanate.

In this aspect, by employing the piezoelectric layer made of the composite oxide containing bismuth ferrite, barium titanate, and bismuth zinc titanate, an occurrence of cracks can be suppressed. Accordingly, a relatively thick piezoelectric layer made of a bismuth ferrite-based piezoelectric material, that is, a piezoelectric layer having a thickness of equal to or greater than 750 nm can be formed. Moreover, since an amount of lead contained is suppressed, an environmental burden can be reduced.

It is preferable that the composite oxide contain 10 mol % or more and 30 mol % or less of the barium titanate, 2 mol % or more and 30 mol % or less of the bismuth zinc titanate, and the bismuth ferrite as the balance. Accordingly, an occurrence of cracks of the piezoelectric layer can be more reliably suppressed. In addition, the piezoelectric layer made of a composite oxide having a single phase in a perovskite structure can be formed.

It is preferable that the bismuth ferrite further contain manganese, and the composite oxide be represented by the following general expression (1):

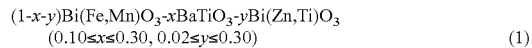

$$(1-x-y)Bi(Fe,Mn)O_3\text{-}xBaTiO_3\text{-}yBi(Zn,Ti)O_3$$
$$(0.10 \le x \le 0.30, 0.02 \le y \le 0.30) \qquad (1)$$

Accordingly, an occurrence of leakage current can be further suppressed.

In addition, it is preferable that the composite oxide contain 10 mol % or more and 25 mol % or less of the barium titanate. Accordingly, an excellent crystal state can be obtained, and an occurrence of cracks of the piezoelectric layer caused by driving of the piezoelectric element can be suppressed.

It is preferable that the composite oxide contain 10 mol % or more and 30 mol % or less of the bismuth zinc titanate. Accordingly, an occurrence of cracks can be more reliably suppressed, and the piezoelectric layer made of a bismuth ferrite-based piezoelectric material having a greater thickness can be formed.

It is preferable that the composite oxide contain 15 mol % or more and 30 mol % or less of the bismuth zinc titanate. Accordingly, an occurrence of cracks can be more reliably suppressed, and the piezoelectric layer made of a bismuth ferrite-based piezoelectric material having a greater thickness can be formed.

It is preferable that the composite oxide contain 20 mol % or more and 30 mol % or less of the bismuth zinc titanate. Accordingly, an occurrence of cracks can be more reliably suppressed, and the piezoelectric layer made of a bismuth ferrite-based piezoelectric material having a greater thickness can be formed.

According to another aspect of the invention, there is provided a liquid ejecting apparatus including the liquid ejecting head described above.

In this aspect, since the piezoelectric element in which an environmental burden is low and an occurrence of cracks is suppressed is included, the liquid ejecting apparatus having excellent reliability can be realized.

According to still another aspect of the invention, there is provided a piezoelectric element including: a piezoelectric layer; and an electrode provided on the piezoelectric layer, wherein the piezoelectric layer is made of a composite oxide containing bismuth ferrite, barium titanate, and bismuth zinc titanate.

In this aspect, by employing the piezoelectric layer made of the composite oxide containing bismuth ferrite, barium titanate, and bismuth zinc titanate, an occurrence of cracks can be suppressed. Accordingly, a relatively thick piezoelectric layer made of a bismuth ferrite-based piezoelectric material, that is, a piezoelectric layer having a thickness of equal to or greater than 750 nm can be formed. Moreover, since an amount of lead contained is suppressed, an environmental burden can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
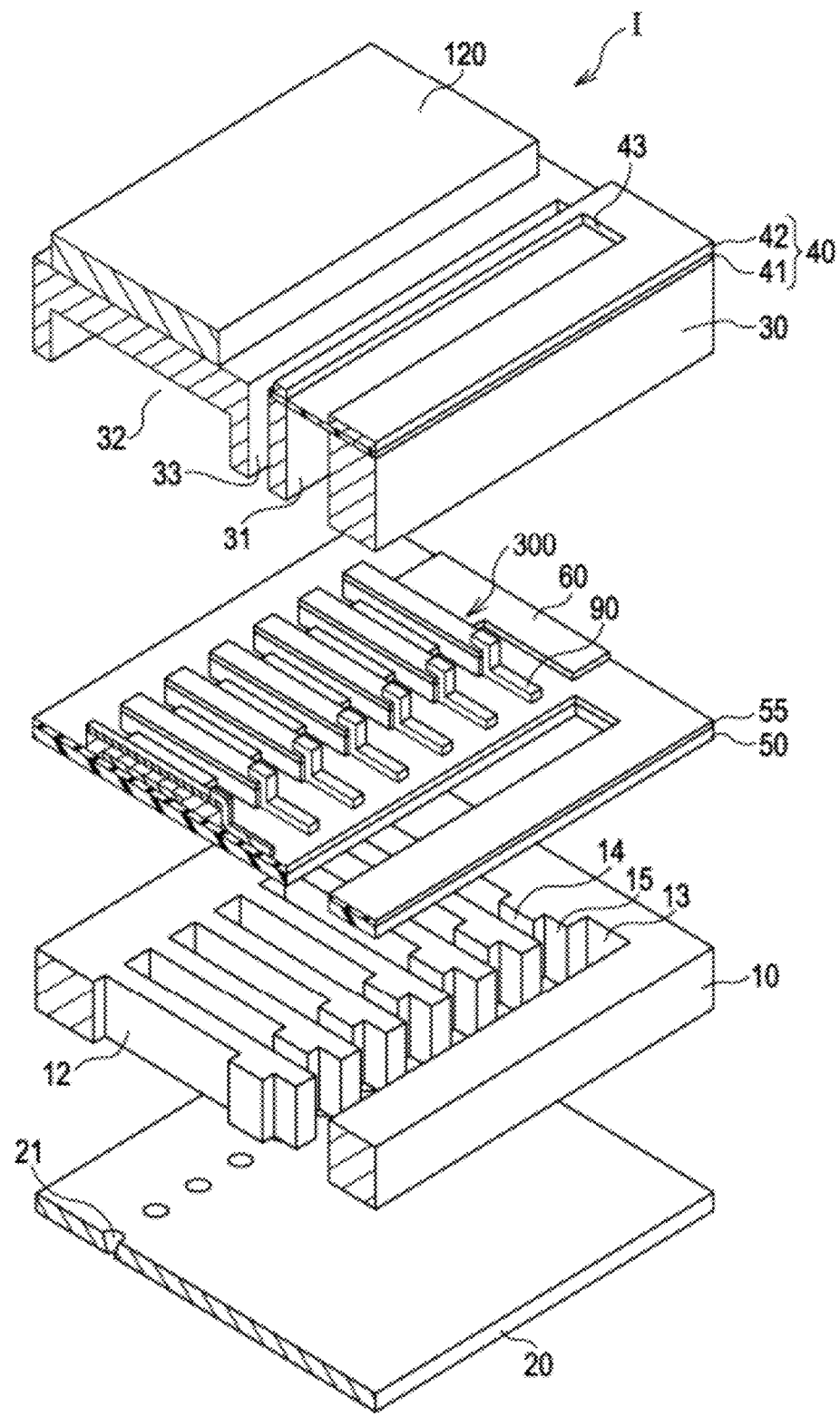
FIG. 1 is an exploded perspective view illustrating a simplified configuration of a recording head according to a first embodiment.
Figure 2A:
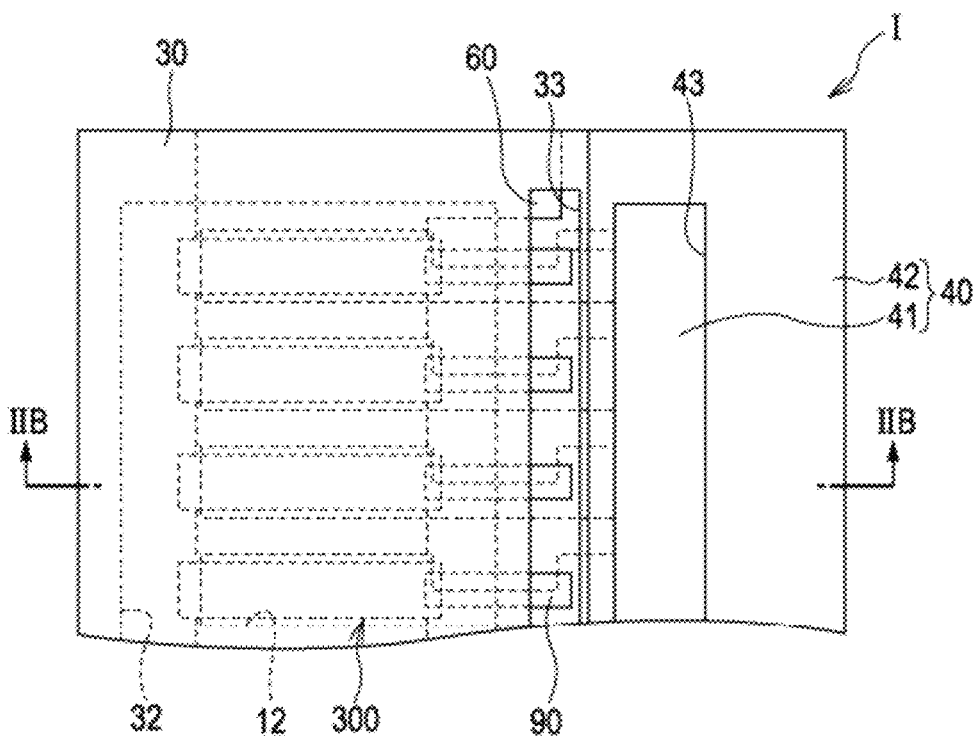
FIGS. 2A and 2B are a plan view and a cross-sectional view of the recording head according to the first embodiment.
Figure 2B:
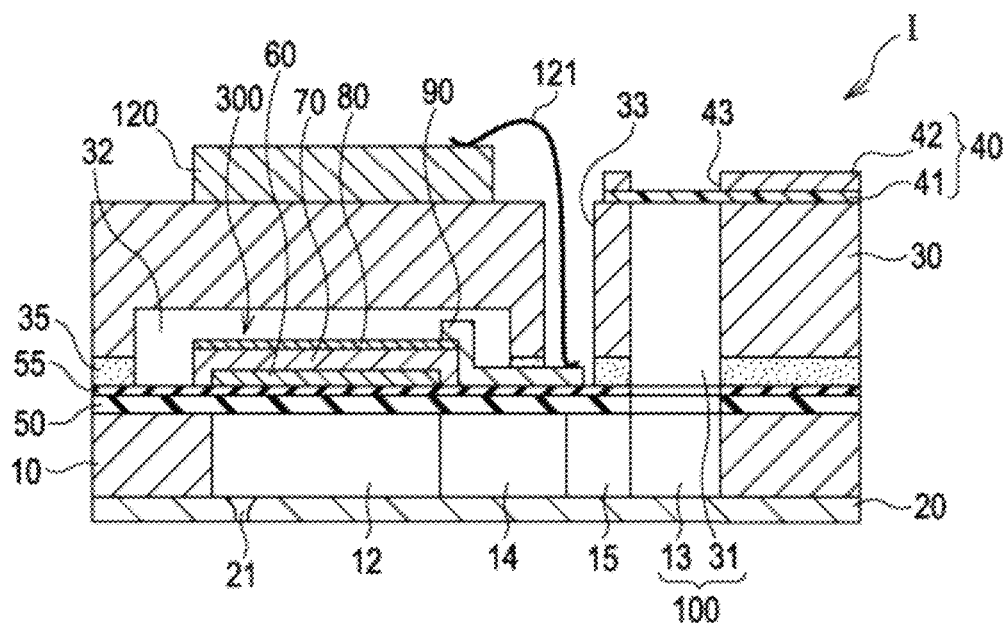

FIG. 1 is an exploded perspective view of an ink jet type recording head which is an example of a liquid ejecting head according to a first embodiment of the invention. FIGS. 2A and 2B are a plan view of FIG. 1 and a cross-sectional view taken along the line IIB-IIB.

In a flow path formation substrate 10, a plurality of pressure generation chambers 12 are arranged in parallel in the width direction. In addition, a communication portion 13 is formed in an outer region in the longitudinal direction of the pressure generation chamber 12 of the flow path formation substrate 10, and the communication portion 13 communicates with each of the pressure generation chambers 12 via an ink supply path 14 and a communication path 15 provided for each of the pressure generation chambers 12. The communication portion 13 communicates with a manifold portion 31 of a protective substrate described later and configures a part of a manifold which is a common ink chamber of the pressure generation chambers 12. The ink supply path 14 is formed to have a smaller width than the pressure generation chamber 12 so as to maintain the flow path resistance of ink flowing into the pressure generation chamber 12 from the communication portion 13 at a constant level. In addition, in this embodiment, the ink supply path 14 is formed by narrowing the width of the flow path from one side. However, the ink supply path may also be formed by narrowing the width of the flow path from both sides. In addition, the ink supply path may be formed by narrowing the flow path in the thickness direction instead by narrowing the width of the flow path. In this embodiment, the flow path formation substrate 10 is provided with a liquid flow path configured of the pressure generation chamber 12, the communication portion 13, the ink supply path 14, and the communication path 15.

In addition, on an opening surface side of the flow path formation substrate 10, a nozzle plate 20 in which nozzle openings 21 communicating in the vicinity of an end portion on the opposite side to the ink supply path 14 of each of the pressure generation chambers 12 are bored is fixed by an adhesive, a thermal bonding film, or the like. In addition, the nozzle plate 20 is made of, for example, glass ceramics, a single crystal silicon substrate, or stainless steel.

On the other hand, on the opposite side of the flow path formation substrate 10 to the opening surface, an elastic film 50 made of silicon dioxide is formed, and an insulating film 55 made of zirconium oxide is formed on the elastic film 50. Furthermore, on the insulating film 55, a first electrode 60, a piezoelectric layer 70 which is provided above the first electrode 60 and is a thin film having a thickness of equal to or less than 3 μm, preferably of 0.3 to 1.5 μm, and a second electrode 80 provided above the piezoelectric layer 70 are laminated, thereby constituting a piezoelectric element 300. In addition, "above" mentioned here includes immediately above and a state in which another member is interposed. Here, the piezoelectric element 300 refers to a part including the first electrode 60, the piezoelectric layer 70, and the second electrode 80. In general, the piezoelectric element 300 is configured by using any one of the electrodes of the piezoelectric element 300 as a common electrode and patterning the other electrode and the piezoelectric layer 70 for each of the pressure generation chambers 12. In this embodiment, the first electrode 60 is used as the common electrode of the piezoelectric element 300, and the second electrode 80 is used as an individual electrode of the piezoelectric element 300. However, in circumstances of driving circuits or wires, this may also be reversed. In addition, hereinafter, the piezoelectric element 300 provided to be displaced is referred to as an actuator device. In the example described above, the elastic film 50, the insulating film 55, and the first electrode 60 act as vibration plates. However, of course, this embodiment is not limited to this example, and for example, without providing the elastic film 50 and the insulating film 55, only the first electrode 60 may act as a vibration plate. In addition, the piezoelectric element 300 itself may also have the function of the vibration plate in practice.

In this embodiment, the piezoelectric material constituting the piezoelectric layer 70 is made of a composite oxide containing bismuth ferrite, barium titanate, and bismuth zinc titanate. The composite oxide is made of a composite oxide represented as a mixed crystal of bismuth ferrite, barium titanate, and bismuth zinc titanate. The composite oxide becomes a single crystal (mixed crystal) in which bismuth ferrite, barium titanate, and bismuth zinc titanate are homogeneously incorporated as a solid solution. In other words, the composite oxide is based on the technical concept that bismuth ferrite, barium titanate, and bismuth zinc titanate are added, and becomes a single crystal (mixed crystal) without bismuth ferrite, barium titanate, and bismuth zinc titanate that are present individually. Accordingly, compared to a system which does not contain bismuth zinc titanate, that is, a composite oxide represented as a mixed crystal of bismuth ferrite and barium titanate, an occurrence of cracks can be suppressed. Therefore, the ink jet type recording head of this embodiment has excellent reliability. Moreover, in this embodiment, since the piezoelectric layer 70 does not contain lead, an environments burden can be reduced.

The piezoelectric layer 70 is made of the composite oxide described above and thus can be formed to be thick, for example, to be equal to or greater than 750 nm. In a case of a piezoelectric layer made of a bismuth ferrate manganate-based composite oxide, for example, in a case of a piezoelectric layer made of a composite oxide represented as a mixed crystal of bismuth ferrate manganate and barium titanate, when the piezoelectric layer is formed to be thick, cracks are more likely to occur during production or several days after production. However, regarding the piezoelectric layer made of the composite oxide made of the above-described configuration, even when the piezoelectric layer is formed to be thick, an occurrence of cracks during production or several days after production can be suppressed. By forming the piezoelectric layer 70 in such a manner so as to be thick, a piezoelectric displacement amount can be increased.

The composite oxide described above may contain other compounds, or bismuth ferrite may contain another metal. For example, a part of bismuth in bismuth ferrite may be replaced by one or more kinds of metal such as lanthanum (La), cerium (Ce), and samarium (Sm), or a part of iron in bismuth ferrite may be replaced by one or more kinds of metal such as aluminum (Al), manganese (Mn), cobalt (Co), and chromium (Cr). For example, in the above-described composite oxide may be a composite oxide to which $(Bi,K)TiO_3$, $(Bi,Na)TiO_3$, and $(Li,Na,K)(Ta,Nb)O_3$ are added.

It is preferable that the composite oxide contain 10 mol % or more and 30 mol % or less of barium titanate, 2 mol % or more and 30 mol % or less of bismuth zinc titanate, and bismuth ferrite as the balance. The piezoelectric layer 70 made of the composite oxide more reliably suppresses an occurrence of cracks. By satisfying the values, the piezoelectric layer 70 is formed which is made of a single phase composite oxide having a perovskite structure without having a different phase such as a pyrochlore phase as shown in the Examples described later. In addition, when less than 2 mol % of bismuth zinc titanate is contained, there is a concern that the effect of suppressing an occurrence of cracks cannot be sufficiently obtained, and when more than 30 mol % of bismuth zinc titanate is contained, there is a concern that a composite oxide in which different phases are present is formed. "Does not have a different phase" mentioned here refers to, for example, when the piezoelectric layer 70 is measured according to X-ray diffractometry (XRD), the peak of a different phase is not observed and only the peak caused by a perovskite structure is observed.

Here, the piezoelectric layer 70 according to this embodiment has a perovskite structure, that is, an $ABO_3$ type structure. An A site in this structure has 12-fold oxygen coordination, and a B site has 6-fold oxygen coordination, thereby forming an octahedron. In addition, bismuth (Bi) and barium (Ba) are located in the A site, and iron (Fe), titanium (Ti), and zinc (Zn) are located in the B site. That is, the composite oxide becomes a single crystal (mixed crystal) in which bismuth ferrite, barium titanate, and bismuth zinc titanate are homogeneously incorporated as a solid solution.

In this embodiment, bismuth ferrite contains manganese. That is, the composite oxide is represented as a mixed crystal of bismuth ferrate manganate $(Bi(Fe,Mn)O_3)$, barium titanate $(BaTiO_3)$, and bismuth zinc titanate $(Bi(Zn,Ti)O_3)$. It is preferable that the composite oxide be represented by, for example, the following general expression (1). That is, it is preferable that the compositional ratio represented by the following general expression (1) be satisfied. Here, the technology of the following general expression (1) is composition notation based on stoichiometry, and inevitable compositional deviation due to elemental diffusion, lattice mismatch, oxygen deficiency, and the like is allowed.

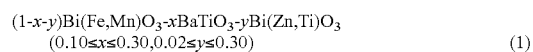

$$(1-x-y)Bi(Fe,Mn)O_3\text{-}xBaTiO_3\text{-}yBi(Zn,Ti)O_3$$
$$(0.10 \leq x \leq 0.30, 0.02 \leq y \leq 0.30) \qquad (1)$$

The piezoelectric layer 70 made of the composite oxide can more reliably suppress an occurrence of cracks and suppress an occurrence of leakage current. In addition, the piezoelectric layer 70 is formed which is made of the single phase composite oxide having the perovskite structure without having different phases. The piezoelectric layer 70 according to this embodiment has a perovskite structure, that is, an $ABO_3$ type structure. An A site in this structure has 12-fold oxygen coordination, and a B site has 6-fold oxygen coordination, thereby forming an octahedron. In addition, bismuth (Bi) and barium (Ba) are located in the A site, and iron (Fe), manganese (Mn), titanium (Ti), and zinc (Zn) are located in the B site.

In addition, the composite oxide constituting the piezoelectric layer contains 10 mol % or more and 30 mol % or less of barium titanate, and preferably 10 mol % or more and 25 mol % or less of barium titanate. By causing the compositional ratio of barium titanate in the composite oxide to be 10 mol % or more and 25 mol % or less, the piezoelectric layer 70 having an excellent crystal state in which crystal grains are relatively uniform can be formed. Accordingly, an occurrence of cracks of the piezoelectric layer 70 caused by driving the piezoelectric element 300 can be suppressed. In addition, when more than 25 mol % of barium titanate is contained, there is a concern that crystal is subjected to abnormal growth and surface smoothness is degraded. On the other hand, when less than 10 mol % of barium titanate is contained, there is a concern that displacement characteristics are degraded.

The composite oxide constituting the piezoelectric layer contains 2 mol % or more and 30 mol % or less of bismuth zinc titanate, preferably 10 mol % or more and 30 mol % or less, more preferably 15 mol % or more and 30 mol % or less, and particularly preferably 20 mol % or more and 30 mol % or less of bismuth zinc titanate. This is because an occurrence of cracks of the piezoelectric layer 70 is more easily suppressed by causing the compositional ratio of the bismuth zinc titanate in the composite oxide to have the values described above. By causing the compositional ratio of bismuth zinc titanate to be 2 mol % or more and 30 mol % or less, and by changing production conditions such as a film forming condition of the piezoelectric layer 70 and a firing condition, an occurrence of cracks is suppressed and the piezoelectric layer 70 having a great thickness can be formed. However, by causing the compositional ratio of bismuth zinc titanate to be 10 mol % or more and 30 mol % or less, an occurrence of cracks can be more reliably suppressed, and the piezoelectric layer 70 having a greater thickness can be formed. In addition, by causing the compositional ratio of bismuth zinc titanate to be 15 mol % or more and 30 mol % or less, and specifically 20 mol % or more and 30 mol % or less, even though the piezoelectric layer 70 having a greater thickness is formed, cracks can be suppressed.

Regarding the composite oxide, the molar ratio (Zn/Ti) of zinc to titanium in the bismuth zinc titanate (Bi(Zn,Ti)O$_3$) is not particularly limited, and is, for example, equal to or more than 0.67 and equal to or less than 1.5. That is, in the general expression described above, bismuth ferrate manganate is expressed by Bi(Zn$_\beta$,Ti$_{1-\beta}$)O$_3$, where $0.4 \leq \beta \leq 0.6$. In this embodiment, $\beta=0.5$, that is, Bi(Zn$_{0.5}$,Ti$_{0.5}$)O$_3$ is satisfied.

The composite oxide according to this embodiment contains manganese in bismuth ferrite. However, in the general expression (1) described above, the molar ratio (Mn/Fe) of manganese to iron is not particularly limited, and may be in a range applied when bismuth ferrate manganate is typically used as a piezoelectric material having a perovskite structure, for example, equal to or more than 0 and equal to or less than 0.10. That is, in the general expression, bismuth ferrate manganate is expressed by Bi(Fe$_\alpha$,Mn$_{1-\alpha}$)O$_3$, where $0.90 \leq \alpha \leq 1$.

To each of the second electrodes 80 which are individual electrodes of the piezoelectric elements 300, a lead electrode 90 which is drawn from the vicinity of the end portion of the ink supply path 14 side, extends to the elastic film 50 or to the insulating film provided as needed, and is made of, for example, gold (Au) is connected.

On the flow path formation substrate 10 on which the piezoelectric element 300 is formed, that is, on the first electrode 60, the elastic film 50, the insulating film provided as needed, and the lead electrode 90, a protective substrate 30 having the manifold portion 31 that constitutes at least a part of the manifold 100 is bonded via an adhesive 35. In this embodiment, the manifold portion 31 penetrate through the protective substrate 30 in the thickness direction and is formed along the width direction of the pressure generation chamber 12, and communicates with the communication portion 13 of the flow path formation substrate 10 as described above to configure the manifold 100 which is the common ink chamber of the pressure generation chambers 12. In addition, the communication portion 13 of the flow path formation substrate 10 may be divided into a plurality of portions for each of the pressure generation chamber 12 such that only the manifold portion 31 serves as the manifold. Moreover, for example, only the pressure generation chamber 12 may be provided in the flow path formation substrate 10, and the ink supply path 14 communicating with the manifold 100 and each of the pressure generation chambers 12 may be provided in a member (for example, the elastic film 50 or the insulating film 55) interposed between the flow path formation substrate 10 and the protective substrate 30.

In addition, in a region opposing the protective substrate 30 and the piezoelectric element 300, a piezoelectric element holding portion 32 having a space so as not to impede the movement of the piezoelectric element 300 is provided. The piezoelectric element holding portion 32 may have a space so as not to impede the movement of the piezoelectric element 300, and the space may be sealed or may not be sealed.

It is preferable that a material having substantially the same coefficient of thermal expansion as that of the flow path formation substrate 10, for example, a glass or ceramic material be used for the protective substrate 30. In this embodiment, the protective substrate 30 is formed using a silicone single crystal substrate made of the same material as that of the flow path formation substrate 10.

In addition, the protective substrate 30 is provided with a through-hole 33 which penetrates through the protective substrate 30 in the thickness direction. In addition, the vicinity of the end portion of the lead electrode 90 drawn from each of the piezoelectric elements 300 is provided to be exposed to the through-hole 33.

A driving circuit 120 for driving the piezoelectric elements 300 arranged in parallel is fixed onto the protective substrate 30. As the driving circuit 120, for example, a circuit board or a semiconductor integrated circuit (IC) may be used. In addition, the driving circuit 120 and the lead electrode 90 are electrically connected to each other via a connection wire 121 made of a bonding wire or a conductive wire.

A compliance substrate 40 configured of a sealing film 41 and a fixed plate 42 is bonded onto the protective substrate 30. Here, the sealing film 41 is made of a material having a low rigidity and flexibility, and one side of the manifold portion 31 is sealed by the sealing film 41. The fixed plate 42 is formed of a relatively hard material. A region of the fixed plate 42 opposing the manifold 100 is an opening portion 43 from which the fixed plate 42 is completely removed in the thickness direction, so that the one side of the manifold 100 is sealed only by the sealing film 41 having flexibility.

In the ink jet type recording head I in this embodiment, ink is taken in from an ink introduction port connected to an external ink supply unit (not shown), the ink is filled therein so as to reach the nozzle opening 21 from the manifold 100, and thereafter a voltage is applied between the first and second electrodes 60 and 80 corresponding to the pressure generation chamber 12 according to a recording signal from the driving circuit 120 so as to cause the elastic film 50, the first electrode 60, and the piezoelectric layer 70 to be subjected to flexural deformation, such that the pressure in each of the pressure generation chambers 12 is increased, thereby discharging ink droplets from the nozzle openings 21. In the embodiment of the invention, since pressure resistance is high, insulation breakdown of the piezoelectric element 300 does not occur even though a high voltage is applied. Therefore, the ink jet type recording head I can be driven by applying a high voltage.

Next, an example of a production method of the ink jet type recording head of this embodiment will be described with reference to FIGS. 3A to 7B. FIGS. 3A to 7B are cross-sectional views of the pressure generation chamber in the longitudinal direction.

Figure 3A:
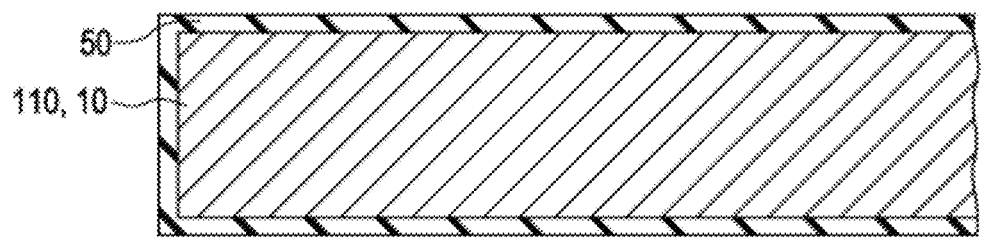
FIGS. 3A and 3B are cross-sectional views illustrating production processes of the recording head according to the first embodiment.
Figure 3B:
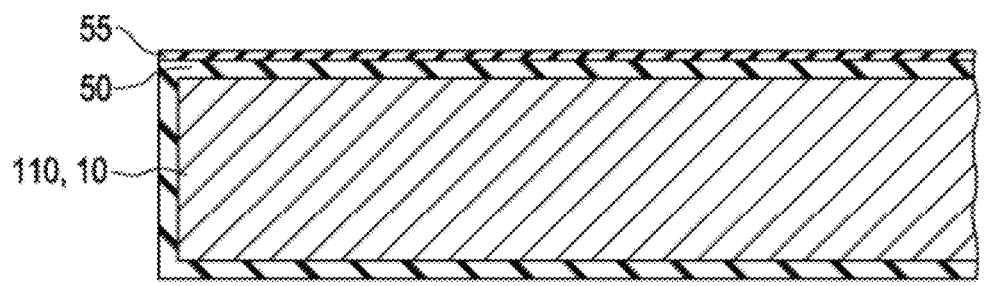

First, as shown in FIG. 3A, a silicon dioxide film made of silicon dioxide (SiO$_2$) for constituting the elastic film 50 is formed on the surface of a wafer 110 for the flow path formation substrate which is a silicon wafer by thermal oxidation or the like. Thereafter, as shown in FIG. 3B, the insulating film 55 made of zirconium oxide is formed on the elastic film 50.

Figure 4A:
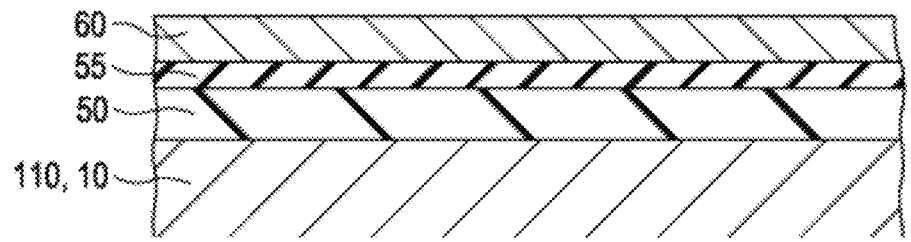
FIGS. 4A to 4C are cross-sectional views illustrating production processes of the recording head according to the first embodiment.
Figure 4B:
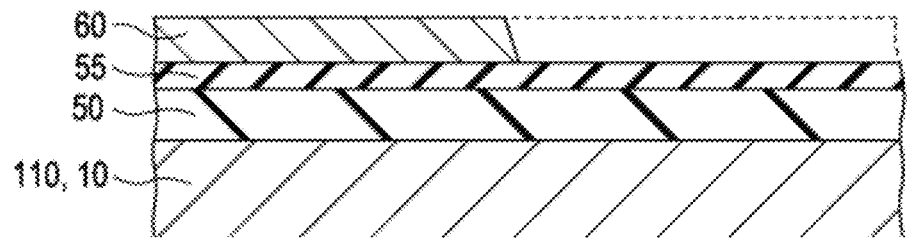

Next, as shown in FIG. 4A, the first electrode 60 is formed over the entire surface of the insulating film 55. Specifically, the first electrode 60 made of platinum, iridium, iridium oxide, or a laminated structure thereof is formed on the insulating film 55. In addition, the first electrode 60 may be formed by, for example, a sputtering method or a deposition method. Next, as shown in FIG. 4B, the first electrode 60 is patterned at the same time so as to cause the side surface of the first electrode 60 to be inclined using a resist (not shown) having a predetermined shape as a mask on the first electrode 60.

Then, after peeling the resist, the piezoelectric layer 70 is laminated on the first electrode 60 (and the insulating film 55). The production method of the piezoelectric layer 70 is not particularly limited, and for example, the piezoelectric layer 70 may be produced using a chemical solution method such as a MOD (Metal-Organic Decomposition) method in which a solution containing a metal complex is applied, dried, and baked at a higher temperature to obtain a piezoelectric layer (piezoelectric film) made of a metal oxide, and a sol-gel method. Besides, the piezoelectric layer 70 can also be produced by a liquid-phase method, a solid-phase method, and a gas-phase method including a laser ablation method, a sputtering method, a pulse laser deposition method (PLD method), a CVD method, and an aerosol deposition method.

Figure 4C:
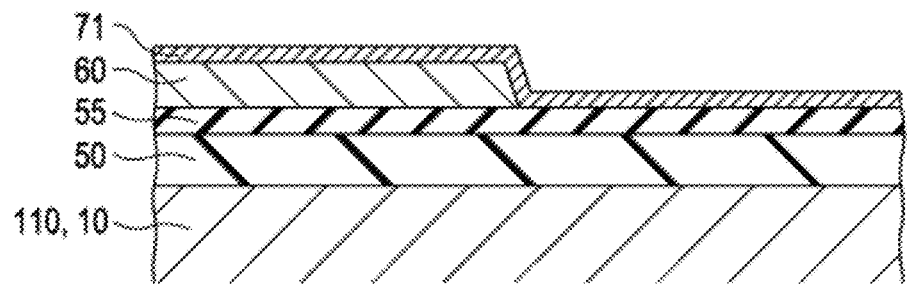

As a specific formation order in a case where the piezoelectric layer 70 is formed by the chemical solution method, first, as shown in FIG. 4C, a composition (precursor solution) for piezoelectric film formation, which is made of an MOD solution containing a metal complex, specifically, a metal complex containing Bi, Fe, Mn, Ba, Ti, and Zn or a sol is applied onto the first electrode 60 using the spin coating method, thereby forming a piezoelectric precursor film 71 (application process).

The applied precursor solution is obtained by dissolving or dispersing a metal complex mixture that can form a composite oxide containing Bi, Fe, Mn, Ba, Ti, and Zn by baking into an organic solvent. The metal complex mixture is a mixture of metal complexes containing one or more kinds of metal from among metals constituting a composite oxide, and metal complexes are mixed so as to cause metals to have desired molar ratios. The mixing ratio of the metal complexes respectively containing Bi, Fe, Mn, Ba, Ti, and Zn is a ratio to achieve a composite oxide represented as a mixed crystal of bismuth ferrate manganate, barium titanate, and bismuth zinc titanate. Here, it is preferable that the metal complexes be mixed to satisfy the following general expression (1):

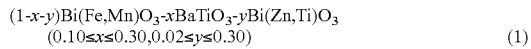

$$(1-x-y)Bi(Fe,Mn)O_3-xBaTiO_3-yBi(Zn,Ti)O_3$$
$$(0.10 \leq x \leq 0.30, 0.02 \leq y \leq 0.30) \quad (1)$$

As the metal complexes respectively containing Bi, Fe, Mn, Ba, Ti, and Zn, for example, alkoxide, organic acid salt, β diketone complex, and the like may be used. Examples of the metal complex containing Bi include bismuth 2-ethylhexanoate and bismuth acetate. Examples of the metal complex containing Fe include iron 2-ethylhexanoate and iron acetate. Examples of the metal complex containing Mn include manganese 2-ethylhexanoate and manganese acetate. Examples of the metal complex containing Ba include barium isopropoxide, barium 2-ethylhexanoate, and barium acetylacetonate. Examples of the metal complex containing Ti include titanium isopropoxide, titanium 2-ethylhexanoate, and titanium(di-1-propoxide)bis(acetylacetonate). Examples of the metal complex containing Zn include zinc 2-ethylhexanoate. Of course, a metal complex containing two or more of Bi, Fe, Mn, Ba, Ti, and Zn may also be used.

In addition, the solvent may be any solvent that can dissolve and disperse the metal complex mixture, and although not particularly limited, various solvents such as toluene, xylene, octane, ethylene glycol, 2-methoxyethanol, butanol, ethanol, isopropyl alcohol, acetic acid, and water may be employed. Of course, two or more of these examples may also be used.

Thereafter, the piezoelectric precursor film 71 is heated at a predetermined temperature (for example, 130° C. to 200° C.) and dried for a predetermined time (drying process). Next, the dried piezoelectric precursor film 71 is heated at a predetermined temperature (for example, 350° C. to 450° C.) and maintained for a predetermined time so as to be degreased (degreasing process). "Degreasing" mentioned here refers to separating an organic component contained in the piezoelectric precursor film 71 as, for example, $NO_2$, $CO_2$, and $H_2O$. The atmosphere of the drying process or the degreasing process is not limited, and be the air, an oxygen atmosphere, or an inert gas atmosphere. In addition, the application process, the drying process, and the degreasing process may be performed at the same time a plurality of times.

Figure 5A:
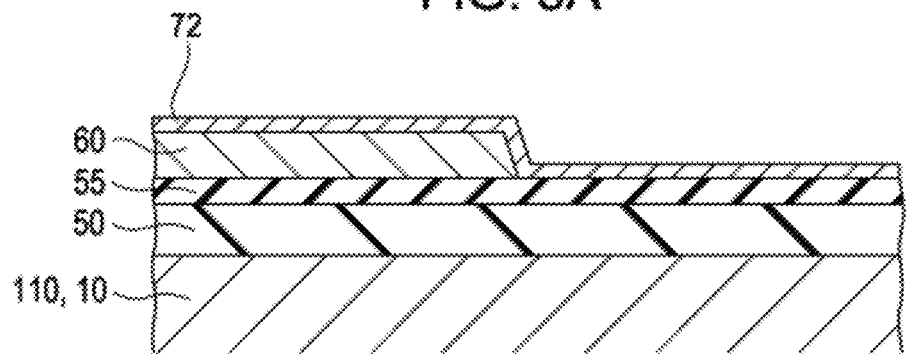
FIGS. 5A and 5B are cross-sectional views illustrating production processes of the recording head according to the first embodiment.

Next, as shown in FIG. 5A, the piezoelectric precursor film 71 is heated at a predetermined temperature, for example, a temperature of about 600° C. to 850° C. and maintained for a predetermined time, for example, 1 to 10 minutes so as to be crystallized, thereby forming the piezoelectric film 72 made of a piezoelectric material containing a composite oxide represented as a mixed crystal of bismuth ferrate manganate, barium titanate, and bismuth zinc titanate (baking process). Even in this baking process, the atmosphere is not limited, and may be the air, an oxygen atmosphere, or an inert gas atmosphere.

As a heating apparatus used in the drying process, the degreasing process, and the baking process, for example, there are an RTA (Rapid Thermal Annealing) apparatus which performs heating by illumination of an infrared lamp, and a hot plate.

Figure 5B:
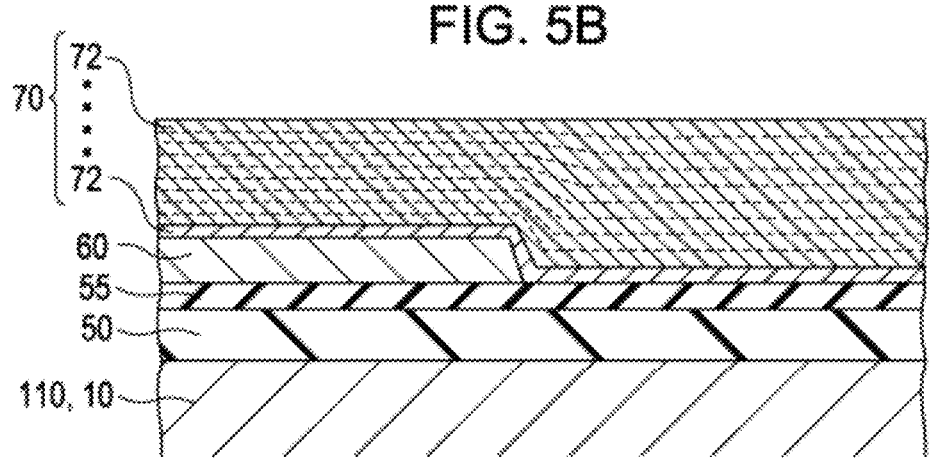

Then, after peeling the resist, the application process, the drying process, and the degreasing process described above, or the application process, the drying process, the degreasing process, and the baking process are repeated a plurality of times according to a desired thickness to form a plurality of the piezoelectric films 72, such that the piezoelectric layer 70 having a predetermined thickness configured of the plurality of piezoelectric films 72 as shown in FIG. 5B is formed. In this embodiment, the piezoelectric layer 70 is provided by laminating the piezoelectric films 72 but may also have only a single piezoelectric film 72.

After forming the piezoelectric layer 70 as described above, as shown in FIG. 6A, the second electrode 80 made of platinum is formed on the piezoelectric layer 70 by the sputtering method or the like, and the piezoelectric layer 70 and the second electrode 80 are patterned at the same time on a region opposing each of the pressure generation chambers 12, thereby forming the piezoelectric element 300 configured of the first electrode 60, the piezoelectric layer 70, and the second electrode 80. The patterning of the piezoelectric layer 70 and the second electrode 80 may be collectively performed by performing dry etching via a resist (not shown) formed into a predetermined shape. Thereafter, as needed, postannealing may be performed in a temperature range of 600° C. to 800° C. Accordingly, a good interface can be formed between the piezoelectric layer 70 and the first electrode 60 or the second electrode 80, and crystalline properties of the piezoelectric layer 70 can be improved.

Figure 6A:
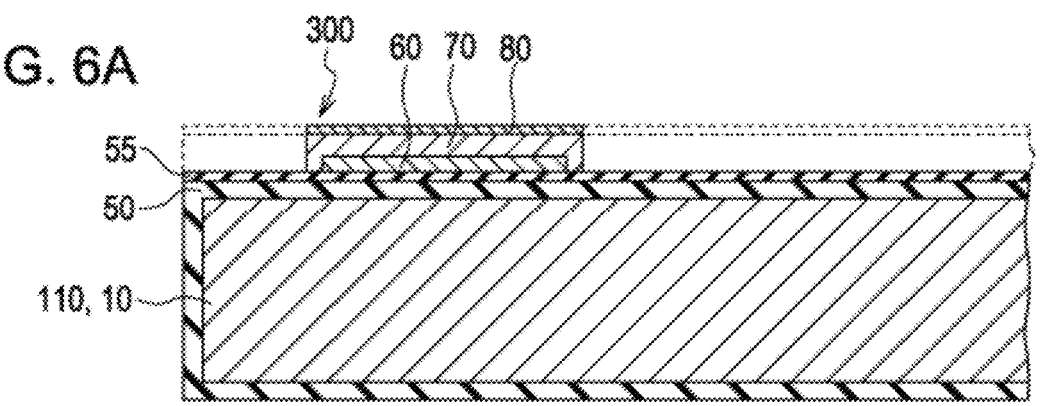
FIGS. 6A to 6C are cross-sectional views illustrating production processes of the recording head according to the first embodiment.
Figure 6B:
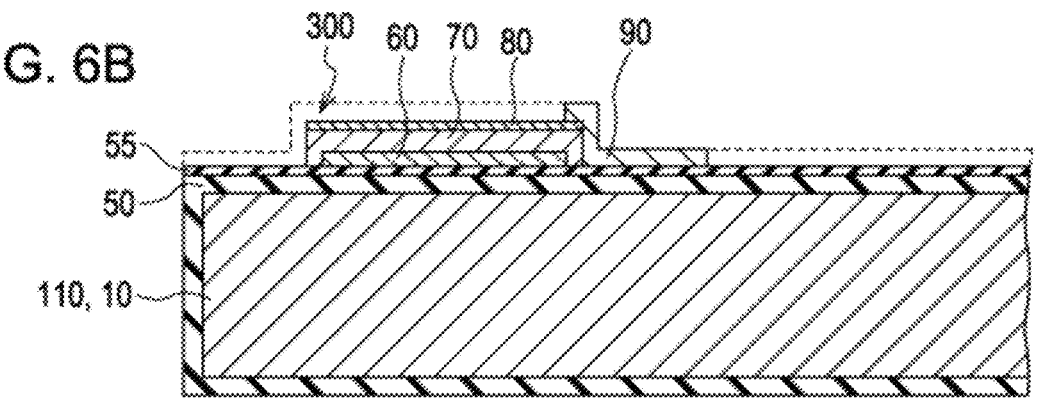

Next, as shown in FIG. 6B, the lead electrode 90 made of, for example, gold (Au) is formed over the entire surface of the wafer 110 for the flow path formation substrate, and thereafter, patterning is performed on each of the piezoelectric elements 300 via, for example, a mask pattern (not shown) made of a resist or the like.

Figure 6C:
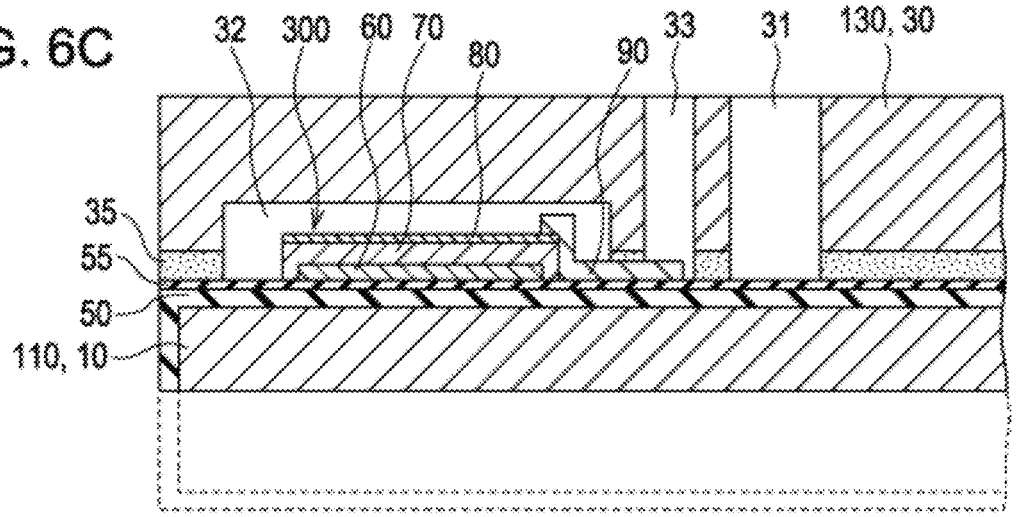

Next, as shown in FIG. 6C, on the piezoelectric element 300 side of the wafer 110 for the flow path formation substrate, a wafer 130 for the protective substrate which is a silicon wafer and is to be a plurality of the protective substrates 30 is bonded via the adhesive 35, and thereafter, the wafer 110 for the flow path formation substrate is thinned into a predetermined thickness.

Figure 7A:
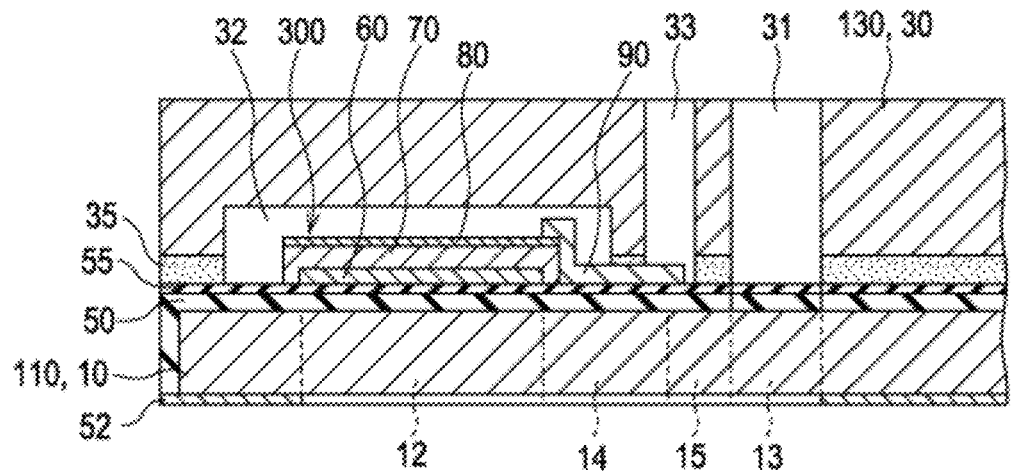
FIGS. 7A and 7B are cross-sectional views illustrating production processes of the recording head according to the first embodiment.

Next, as shown in FIG. 7A, a mask film 52 is newly formed on the wafer 110 for the flow path formation substrate and is patterned into a predetermined shape.

Figure 7B:
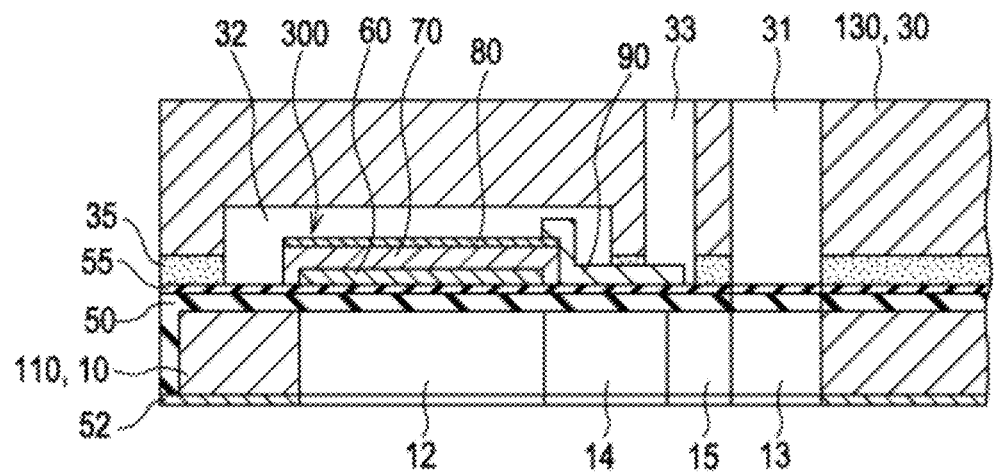

In addition, as shown in FIG. 7B, by performing anisotropic etching (wet etching) using an alkali solution such as KOH via the mask film 52 on the wafer 110 for the flow path formation substrate, the pressure generation chamber 12 corresponding to the piezoelectric element 300, the communication portion 13, the ink supply path 14, the communication path 15, and the like are formed.

Thereafter, unnecessary parts of the outer peripheral edge portions of the wafer 110 for the flow path formation substrate and the wafer 130 for the protective substrate are removed by cutting such as dicing. In addition, after removing the mask film 52 on the surface of the wafer 110 for the flow path formation substrate on the opposite side to the wafer 130 for the protective substrate, the nozzle plate 20 in which the nozzle openings 21 are bored is bonded, the compliance substrate 40 is bonded to the wafer 130 for the protective substrate, and the wafer 110 for the flow path formation substrate and the like are divided into the flow path formation substrates 10 having a single chip size as shown in FIG. 1, thereby constituting the ink jet type recording head I according to this embodiment.

Hereinafter, the embodiment of the invention will be described in more detail according to Examples. In addition, the embodiment of the invention is not limited to the following Examples.

Example 1

First, a silicon dioxide ($SiO_2$) film having a thickness of 1200 nm was formed on the surface of a (100)-oriented single crystal silicon (Si) substrate by thermal oxidation. Next, a titanium film having a thickness of 40 nm was produced on the $SiO_2$ film by an RF magnetron sputtering method, and thermal oxidation was performed thereon, thereby forming a titanium oxide film. Next, a (111)-oriented platinum film (first electrode 60) having a thickness of 100 nm was formed on the titanium oxide film by the RF magnetron sputtering method.

Thereafter, the piezoelectric layer 70 was formed on the first electrode 60 by a spin coating method. The method is as follows. First, an n-octane solution of bismuth 2-ethylhexanoate, iron 2-ethylhexanoate, manganese 2-ethylhexanoate, barium 2-ethylhexanoate, titanium 2-ethylhexanoate, and zinc 2-ethylhexanoate was mixed at a predetermined ratio, thereby preparing a precursor solution.

The precursor solution was dropped on the substrate on which the titanium oxide film and the platinum film were formed, and the substrate was rotated at 3000 rpm, thereby forming a piezoelectric precursor film using such a spin coating method (application process). Next, the substrate was placed on the hot plate and dried at 180° C. for 2 minutes. Thereafter, degreasing was performed thereon at 450° C. for 2 minutes (degreasing process). After performing a process including the application process, the drying process, and the degreasing process once, baking was performed at 750° C. for 5 minutes by the RTA (Rapid Thermal Annealing) apparatus in the oxygen atmosphere (baking process). Thereafter, a process in which the application process, the drying process, and the degreasing process were repeated four times and then the baking process for collectively baking the resultant was performed was repeated twice, and a process in which the application process, the drying process, and the degreasing process were repeated twice and the baking process for collectively baking the resultant was performed once, such that the piezoelectric layer 70 having a total thickness of 750 nm was formed by total 12 application processes.

Thereafter, a platinum film (second electrode) having a thickness of 100 nm was formed on the piezoelectric layer 70 as the second electrode 80 by the sputtering method, and then baking was performed at 750° C. for 5 minutes using the RTA apparatus in the oxygen atmosphere, thereby forming the piezoelectric element 300 having the piezoelectric layer 70 made of a piezoelectric material containing the composite oxide represented as a mixed crystal of bismuth ferrate manganate, barium titanate, and bismuth zinc titanate, specifically, the composite oxide represented as a mixed crystal expressed by $0.73\{Bi(Fe_{0.93},Mn_{0.07})O_3\}$-$0.25\{BaTiO_3\}$-$0.02\{Bi(Zn_{0.5},Ti_{0.5})O_3\}$.

Example 2

The same operations as those of the Example 1 were performed except that the piezoelectric layer 70 containing a composite oxide made of a mixed crystal expressed by $0.85\{Bi(Fe_{0.94},Mn_{0.06})O_3\}$-$0.10\{BaTiO_3\}$-$0.05\{Bi(Zn_{0.5},Ti_{0.5})O_3\}$ was used by changing blending amounts of various metal complexes in the precursor solution.

Example 3

The same operations as those of the Example 1 were performed except that the piezoelectric layer 70 containing a composite oxide made of a mixed crystal expressed by $0.80\{Bi(Fe_{0.94},Mn_{0.06})O_3\}$-$0.15\{BaTiO_3\}$-$0.05\{Bi(Zn_{0.5},Ti_{0.5})O_3\}$ was used by changing blending amounts of various metal complexes in the precursor solution.

Example 4

The same operations as those of the Example 1 were performed except that the piezoelectric layer 70 containing a composite oxide made of a mixed crystal expressed by $0.75\{Bi(Fe_{0.93},Mn_{0.07})O_3\}$-$0.20\{BaTiO_3\}$-$0.05\{Bi(Zn_{0.5},Ti_{0.5})O_3\}$ was used by changing blending amounts of various metal complexes in the precursor solution.

Example 5

The same operations as those of the Example 1 were performed except that the piezoelectric layer 70 containing a composite oxide made of a mixed crystal expressed by $0.70\{Bi(Fe_{0.93},Mn_{0.07})O_3\}$-$0.25\{BaTiO_3\}$-$0.05\{Bi(Zn,Ti)O_3\}$ was used by changing blending amounts of various metal complexes in the precursor solution.

Example 6

The same operations as those of the Example 1 were performed except that the piezoelectric layer 70 containing a composite oxide made of a mixed crystal expressed by $0.65\{Bi(Fe_{0.93},Mn_{0.07})O_3\}$-$0.25\{BaTiO_3\}$-$0.10\{Bi(Zn_{0.5},Ti_{0.5})O_3\}$ was used by changing blending amounts of various metal complexes in the precursor solution.

Example 7

The same operations as those of the Example 1 were performed except that the piezoelectric layer 70 containing a composite oxide made of a mixed crystal expressed by $0.60\{Bi(Fe_{0.92},Mn_{0.08})O_3\}$-$0.25\{BaTiO_3\}$-$0.15\{Bi(Zn,Ti)O_3\}$ was used by changing blending amounts of various metal complexes in the precursor solution.

Example 8

The same operations as those of the Example 1 were performed except that the piezoelectric layer 70 containing a composite oxide made of a mixed crystal expressed by $0.65\{Bi(Fe_{0.95}Mn_{0.08})O_3\}$-$0.20\{BaTiO_3\}$-$0.15\{Bi(Zn_{0.5},$ $Ti_{0.5})O_3\}$ and having a thickness of 1000 nm was used by changing blending amounts of various metal complexes in the precursor solution and forming the piezoelectric layer using a method described as follows.

Formation Method of Piezoelectric Layer

The process including the application process, the drying process, and the degreasing process described in the Example 1 was repeated twice and then the baking process for collectively baking the resultant was performed. Next, the process in which the application process, the drying process, and the degreasing process were repeated four times and then the baking process for collectively baking the resultant was performed was repeated three times. Last, the process in which the application process, the drying process, and the degreasing process were repeated twice and then the baking process for collectively baking the resultant was performed was performed once, such that the piezoelectric layer 70 having a total thickness of 1000 nm was formed by total 16 application processes.

Example 9

The same operations as those of the Example 8 were performed except that the piezoelectric layer 70 containing a composite oxide made of a mixed crystal expressed by $0.65\{Bi(Fe_{0.95},Mn_{0.05})O_3\}$-$0.15\{BaTiO_3\}$-$0.20\{Bi(Zn_{0.5},Ti_{0.5})O_3\}$ was used by changing blending amounts of various metal complexes in the precursor solution.

Example 10

The same operations as those of the Example 8 were performed except that the piezoelectric layer 70 containing a composite oxide made of a mixed crystal expressed by $0.60\{Bi(Fe_{0.95},Mn_{0.05})O_3\}$-$0.20\{BaTiO_3\}$-$0.20\{Bi(Zn_{0.5},Ti_{0.5})O_3\}$ was used by changing blending amounts of various metal complexes in the precursor solution.

Example 11

The same operations as those of the Example 8 were performed except that the piezoelectric layer 70 containing a composite oxide made of a mixed crystal expressed by $0.50\{Bi(Fe_{0.93},Mn_{0.07})O_3\}$-$0.30\{BaTiO_3\}$-$0.20\{Bi(Zn_{0.5},Ti_{0.5})O_3\}$ was used by changing blending amounts of various metal complexes in the precursor solution.

Example 12

The same operations as those of the Example 8 were performed except that the piezoelectric layer 70 containing a composite oxide made of a mixed crystal expressed by $0.55\{Bi(Fe_{0.94},Mn_{0.06})O_3\}$-$0.20\{BaTiO_3\}$-$0.25\{Bi(Zn_{0.5},Ti_{0.5})O_3\}$ was used by changing blending amounts of various metal complexes in the precursor solution.

Example 13

The same operations as those of the Example 8 were performed except that the piezoelectric layer 70 containing a composite oxide made of a mixed crystal expressed by $0.50\{Bi(Fe_{0.93},Mn_{0.07})O_3\}$-$0.20\{BaTiO_3\}$-$0.30\{Bi(Zn_{0.5},Ti_{0.5})O_3\}$ was used by changing blending amounts of various metal complexes in the precursor solution.

Example 14

The same operations as those of the Example 1 were performed except that the piezoelectric layer 70 containing a composite oxide made of a mixed crystal expressed by $0.65\{Bi(Fe_{0.95},Mn_{0.05})O_3\}$-$0.20\{BaTiO_3\}$-$0.15\{Bi(Zn_{0.5},Ti_{0.5})O_3\}$ and having a thickness of 1250 nm was used by changing blending amounts of various metal complexes in the precursor solution and forming the piezoelectric layer using a method described as follows.

Formation Method of Piezoelectric Layer

The process including the application process, the drying process, and the degreasing process described in the Example 1 was repeated twice and then the baking process for collectively baking the resultant was performed. Next, the process in which the application process, the drying process, and the degreasing process were repeated four times and then the baking process for collectively baking the resultant was performed was repeated four times. Last, the process in which the application process, the drying process, and the degreasing process were repeated twice and then the baking process for collectively baking the resultant was performed was performed once, such that the piezoelectric layer 70 having a total thickness of 1250 nm was formed by total 20 application processes.

Example 15

The same operations as those of the Example 14 were performed except that the piezoelectric layer 70 containing a composite oxide made of a mixed crystal expressed by $0.60\{Bi(Fe_{0.95},Mn_{0.05})O_3\}$-$0.20\{BaTiO_3\}$-$0.20\{Bi(Zn_{0.5},Ti_{0.5})O_3\}$ was used by changing blending amounts of various metal complexes in the precursor solution.

Example 16

The same operations as those of the Example 14 were performed except that the piezoelectric layer 70 containing a composite oxide made of a mixed crystal expressed by $0.55\{Bi(Fe_{0.95},Mn_{0.05})O_3\}$-$0.20\{BaTiO_3\}$-$0.25\{Bi(Zn_{0.5},Ti_{0.5})O_3\}$ was used by changing blending amounts of various metal complexes in the precursor solution.

Example 17

The same operations as those of the Example 14 were performed except that the piezoelectric layer 70 containing a composite oxide made of a mixed crystal expressed by $0.50\{Bi(Fe_{0.93},Mn_{0.07})O_3\}$-$0.20\{BaTiO_3\}$-$0.30\{Bi(Zn_{0.5},Ti_{0.5})O_3\}$ was used by changing blending amounts of various metal complexes in the precursor solution.

Example 18

The same operations as those of the Example 14 were performed except that the piezoelectric layer 70 containing a composite oxide made of a mixed crystal expressed by $0.45\{Bi(Fe_{0.92},Mn_{0.08})O_3\}$-$0.20\{BaTiO_3\}$-$0.35\{Bi(Zn_{0.5},Ti_{0.5})O_3\}$ was used by changing blending amounts of various metal complexes in the precursor solution.

Example 19

The same operations as those of the Example 1 were performed except that the piezoelectric layer 70 containing a composite oxide made of a mixed crystal expressed by $0.60\{Bi(Fe_{0.96},Mn_{0.04})O_3\}$-$0.25\{BaTiO_3\}$-$0.15\{Bi(Zn_{0.5},Ti_{0.5})O_3\}$ and having a thickness of 825 nm was used by changing blending amounts of various metal complexes in the precursor solution and forming the piezoelectric layer using a method described as follows.

Formation Method of Piezoelectric Layer

The process including the application process, the drying process, and the degreasing process described in the Example 1 was repeated twice and then the baking process for collectively baking the resultant was performed. Next, the process in which the application process, the drying process, and the degreasing process were repeated four times and then the baking process for collectively baking the resultant was performed was repeated twice. Last, the process in which the application process, the drying process, and the degreasing process were repeated twice and then the baking process for collectively baking the resultant was performed was performed twice, such that the piezoelectric layer 70 having a total thickness of 825 nm was formed by total 14 application processes.

Example 20

The same operations as those of the Example 19 were performed except that the piezoelectric layer 70 containing a composite oxide made of a mixed crystal expressed by $0.60\{Bi(Fe_{0.94},Mn_{0.06})O_3\}$-$0.25\{BaTiO_3\}$-$0.15\{Bi(Zn_{0.5},Ti_{0.5})O_3\}$ was used by changing blending amounts of various metal complexes in the precursor solution.

Example 21

The same operations as those of the Example 19 were performed except that the piezoelectric layer 70 containing a composite oxide made of a mixed crystal expressed by $0.60\{Bi(Fe_{0.92},Mn_{0.08})O_3\}$-$0.25\{BaTiO_3\}$-$0.15\{Bi(Zn_{0.5},Ti_{0.5})O_3\}$ was used by changing blending amounts of various metal complexes in the precursor solution.

Comparative Example 1

The same operations as those of the Example 1 were performed except that zinc 2-ethylhexanoate was not added to the precursor solution, and the piezoelectric layer 70 containing a composite oxide made of a mixed crystal expressed by $0.90\{Bi(Fe_{0.94},Mn_{0.06})O_3\}$-$0.10\{BaTiO_3\}$ was used by changing blending amounts of various metal complexes.

Comparative Example 2

The same operations as those of the Example 1 were performed except that zinc 2-ethylhexanoate was not added to the precursor solution, and the piezoelectric layer 70 containing a composite oxide made of a mixed crystal expressed by $0.85\{Bi(Fe_{0.94},Mn_{0.06})O_3\}$-$0.15\{BaTiO_3\}$ was used by changing blending amounts of various metal complexes.

Comparative Example 3

The same operations as those of the Example 1 were performed except that zinc 2-ethylhexanoate was not added to the precursor solution, and the piezoelectric layer 70 containing a composite oxide made of a mixed crystal expressed by $0.80\{Bi(Fe_{0.94},Mn_{0.06})O_3\}$-$0.20\{BaTiO_3\}$ was used by changing blending amounts of various metal complexes.

Comparative Example 4

The same operations as those of the Example 1 were performed except that zinc 2-ethylhexanoate was not added to the precursor solution, and the piezoelectric layer 70 containing a composite oxide made of a mixed crystal expressed by $0.75\{Bi(Fe_{0.93},Mn_{0.07})O_3\}$-$0.25\{BaTiO_3\}$ was used by changing blending amounts of various metal complexes.

Comparative Example 5

The same operations as those of the Example 8 were performed except that zinc 2-ethylhexanoate was not added to the precursor solution, and the piezoelectric layer 70 containing a composite oxide made of a mixed crystal expressed by $0.75\{Bi(Fe_{0.96},Mn_{0.04})O_3\}$-$0.20\{BaTiO_3\}$ was used by changing blending amounts of various metal complexes.

Comparative Example 6

The same operations as those of the Example 14 were performed except that zinc 2-ethylhexanoate was not added to the precursor solution, and the piezoelectric layer 70 containing a composite oxide made of a mixed crystal expressed by $0.75\{Bi(Fe_{0.96},Mn_{0.04})O_3\}$-$0.25\{BaTiO_3\}$ was used by changing blending amounts of various metal complexes.

Test Example 1

Figure 8:
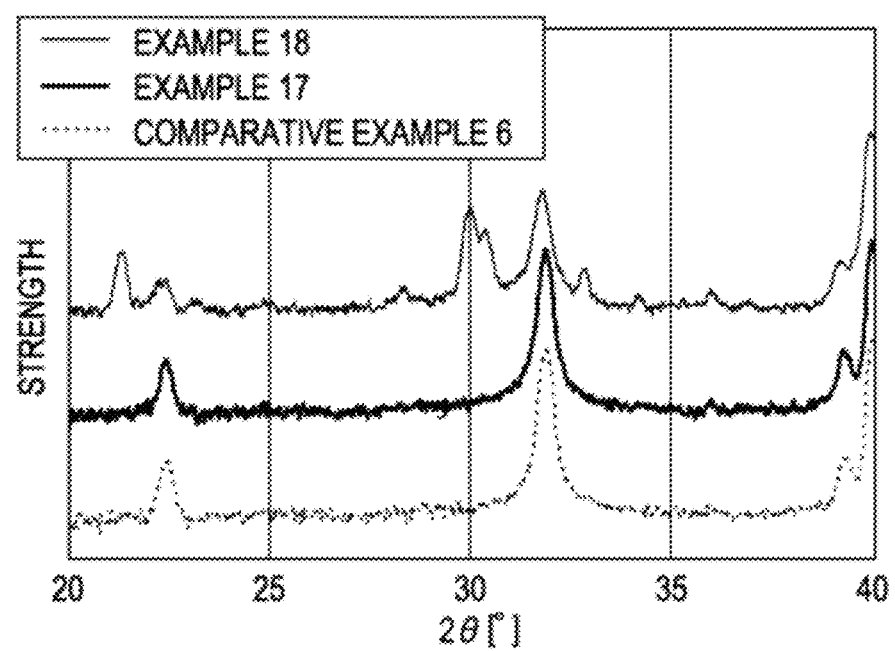
FIG. 8 is a diagram illustrating an X-ray diffraction pattern of Examples and Comparative Examples.

From each of the piezoelectric elements of the Examples 1 to 21 and the Comparative Examples 1 to 6, the X-ray diffraction pattern of the piezoelectric layer 70 was obtained at room temperature (25° C.) using "D8 Discover" produced by Bruker AXS and using CuKα-rays as an X-ray source. As an example of the results, the X-ray diffraction patterns of the Examples 17 and 18 and the Comparative Example 6 are shown in FIG. 8. In Tables 1 to 4, presence or absence of different phases confirmed from the X-ray diffraction pattern is shown. In addition, a case where only a single phase having a perovskite structure was observed is represented by 0, and a case where the perovskite structure and phases different from the perovskite structure were confirmed is represented by Δ.

As a result, in all the Examples 1 to 21 and the Comparative Examples 1 to 6, the peak caused by the perovskite structure and the peak caused by the substrate were observed. In addition, in the Examples 1 to 17 and 19 to 21 and the Comparative Examples 1 to 6, the peak caused by a phase other than the perovskite structure was not confirmed. That is, it could be seen that in the Examples 1 to 17 and 19 to 21 and the Comparative Examples 1 to 6, a different phase was not observed, and there was a single phase having the perovskite structure. On the contrary, in the Example 18, the peak other than the perovskite structure was confirmed around 21° or 30°.

Test Example 2

In the Examples 1 to 21 and the Comparative Examples 1 to 6, for the piezoelectric elements 70 in a state where the second electrode 80 was not formed, presence or absence of an occurrence of cracks until 40 days after formation of the piezoelectric layer 70 was confirmed. The results are shown in Tables 1 to 4. In a case where crack had occurred, the day when cracks had occurred (the number of days after formation) was noted. In Tables 1 to 4, the values of x and y are x and y in the following general expression (1), and in Tables 1 to 4, barium titanate ($BaTiO_3$) is denoted by BT and bismuth zinc titanate ($Bi(Zn,Ti)O_3$) was denoted by BZT.

$$(1-x-y)Bi(Fe,Mn)O_3\text{-}xBaTiO_3\text{-}yBi(Zn,Ti)O_3 \quad (1)$$

Figure 9:
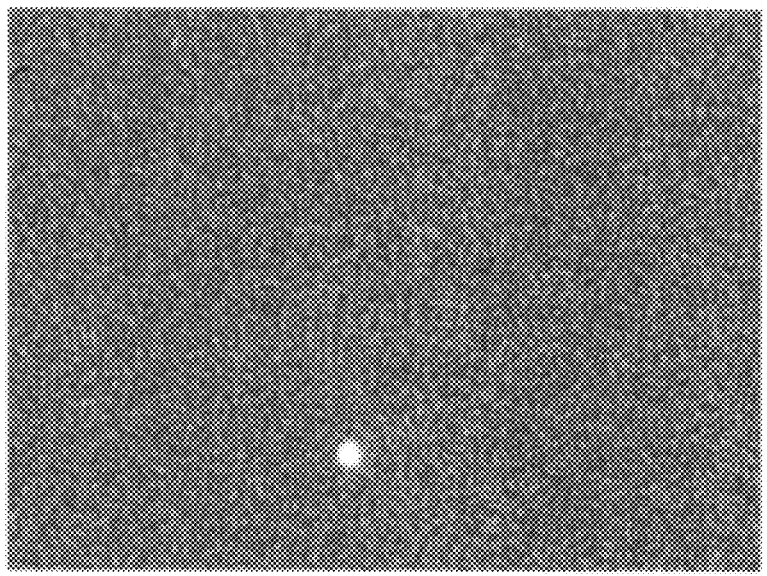
FIG. 9 is a photograph of the surface of a piezoelectric layer of Example 1 observed with a metallograph.
Figure 10:
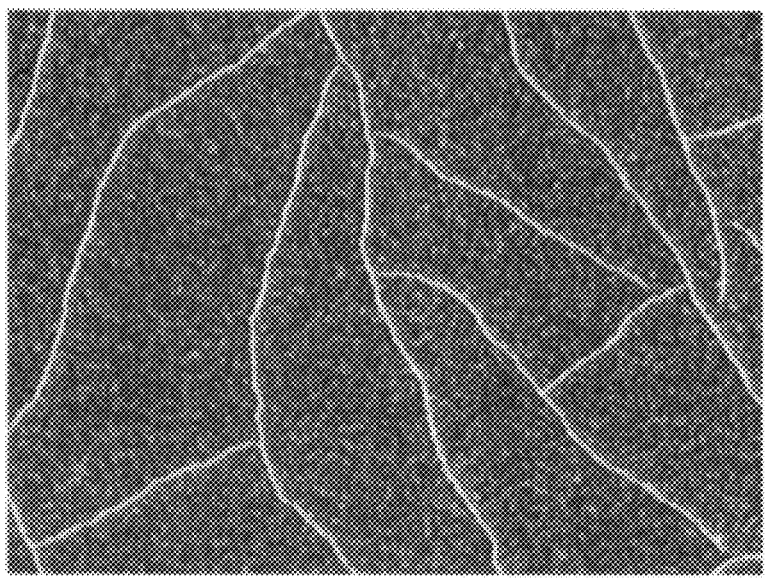
FIG. 10 is a photograph of the surface of a piezoelectric layer of Comparative Example 1 observed with a metallograph.

In the Example 1 and the Comparative Example 1, the results from observation of the surface of the piezoelectric layer 70 one day after the formation of the piezoelectric layer 70 in a dark field using a metallograph at a magnification set to 1000× are shown. The results of the Example 1 are shown in FIG. 9, and the results of the Comparative Example 1 are shown in FIG. 10. As shown in FIG. 9, cracks were not observed in the Example 1. On the other hand, as shown in FIG. 10, cracks had occurred in Comparative Example 1.

TABLE 1

<THICKNESS OF 750 nm OF PIEZOELECTRIC LAYER 70>

| | MOLAR RATIO OF x:BT | MOLAR RATIO OF y:BZT | CRACK | CRYSTAL STRUCTURE |
|---|---|---|---|---|
| EXAMPLE 1 | 0.25 | 0.02 | OCCURRED AFTER 20 DAYS | ○ |
| EXAMPLE 2 | 0.10 | 0.05 | OCCURRED AFTER 20 DAYS | ○ |
| EXAMPLE 3 | 0.15 | 0.05 | OCCURRED AFTER 20 DAYS | ○ |
| EXAMPLE 4 | 0.20 | 0.05 | OCCURRED AFTER 25 DAYS | ○ |
| EXAMPLE 5 | 0.25 | 0.05 | OCCURRED AFTER 20 DAYS | ○ |
| EXAMPLE 6 | 0.25 | 0.10 | NO | ○ |
| EXAMPLE 7 | 0.25 | 0.15 | NO | ○ |
| COMPARATIVE EXAMPLE 1 | 0.10 | 0 | OCCURRED AFTER 6 DAYS | ○ |
| COMPARATIVE EXAMPLE 2 | 0.15 | 0 | OCCURRED AFTER 6 DAYS | ○ |
| COMPARATIVE EXAMPLE 3 | 0.20 | 0 | OCCURRED AFTER 15 DAYS | ○ |
| COMPARATIVE EXAMPLE 4 | 0.25 | 0 | OCCURRED AFTER 6 DAYS | ○ |

TABLE 2

<THICKNESS OF 1000 nm OF PIEZOELECTRIC LAYER 70>

| | MOLAR RATIO OF x:BT | MOLAR RATIO OF y:BZT | CRACK | CRYSTAL STRUCTURE |
|---|---|---|---|---|
| EXAMPLE 8 | 0.20 | 0.15 | NO | ○ |
| EXAMPLE 9 | 0.15 | 0.20 | NO | ○ |
| EXAMPLE 10 | 0.20 | 0.20 | NO | ○ |
| EXAMPLE 11 | 0.30 | 0.20 | NO | ○ THERE IS ABNORMALITY ON OUTER APPEARANCE REGARDED AS ABNORMAL GROWTH OF CRYSTAL |
| EXAMPLE 12 | 0.20 | 0.25 | NO | ○ |
| EXAMPLE 13 | 0.20 | 0.30 | NO | ○ |
| COMPARATIVE EXAMPLE 5 | 0.20 | 0 | OCCURRED AFTER 1 DAY | ○ |

TABLE 3

<THICKNESS OF 1250 nm OF PIEZOELECTRIC LAYER 70>

| | MOLAR RATIO OF x:BT | MOLAR RATIO OF y:BZT | CRACK | CRYSTAL STRUCTURE |
|---|---|---|---|---|
| EXAMPLE 14 | 0.20 | 0.15 | OCCURRED AFTER 1 DAY | ○ |
| EXAMPLE 15 | 0.20 | 0.20 | NO | ○ |
| EXAMPLE 16 | 0.20 | 0.25 | NO | ○ |
| EXAMPLE 17 | 0.20 | 0.30 | NO | ○ |
| EXAMPLE 18 | 0.20 | 0.35 | NO | Δ |
| COMPARATIVE EXAMPLE 6 | 0.25 | 0 | OCCURRED AFTER 1 DAY | ○ |

TABLE 4

<THICKNESS OF 825 nm OF PIEZOELECTRIC LAYER 70>

| | MOLAR RATIO OF x:BT | MOLAR RATIO OF y:BZT | Mn/(Fe + Mn) | CRACK | CRYSTAL STRUCTURE |
|---|---|---|---|---|---|
| EXAMPLE 19 | 0.25 | 0.15 | 0.04 | NO | ○ |
| EXAMPLE 20 | 0.25 | 0.15 | 0.06 | NO | ○ |
| EXAMPLE 21 | 0.25 | 0.15 | 0.08 | NO | ○ |

As shown in Tables 1 to 4, it was confirmed that by adding BZT, that is, by using the composite oxide represented as a mixed crystal of bismuth ferrate manganate, barium titanate, and bismuth zinc titanate, an occurrence of cracks was suppressed.

Specifically, as shown in Table 1, it was confirmed that in the Examples 1 to 5 in which the compositional ratio of BZT in the composite oxide of the piezoelectric layer 70 was 2 to 5 mol %, compared to the Comparative Examples 1 to 4 in which BZT was not added, the day when cracks had occurred is delayed, so that resistance to cracks was enhanced. Moreover, in the Examples 6 and 7 in which the compositional ratios of BZT in the composite oxide of the piezoelectric layer 70 were respectively 10 mol % and 15 mol %, cracks had not occur.

As shown in Table 2, in Comparative Example 5 in which BZT was not added, cracks had immediately occurred. On the contrary, in the Examples 8 to 13 in which the compositional ratio of BZT in the composite oxide of the piezoelectric layer 70 was 15 to 30 mol %, cracks had not occurred even with a thickness of 1000 nm.

As shown in Table 3, in the Examples 15 to 18 in which the compositional ratio of BT in the composite oxide of the piezoelectric layer 70 was 20 mol % and the compositional ratio of BZT was 20 to 35 mol %, cracks had not occurred even with a thickness of 1250 nm.

As shown in Tables 1 to 4, in the Comparative Examples 1 to 6 and in the Examples 1 to 17 and 19 to 21 in which the composite oxides that satisfy $0.02 \leq y \leq 0.30$ were used, it was confirmed that the composite oxides were made of a single crystal having the perovskite structure. On the contrary, in the Example 18 in which y=0.35, that is, the compositional ratio of BZT was 35 mol %, a phase different from the crystal having the perovskite structure was confirmed. From this, it is thought that it is preferable that the compositional ratio of BZT in the composite oxide be equal to or less than 30 mol %.

In addition, in the Example 11 in which x=0.30, that is, the compositional ratio of BT was 30 mol %, cracks had not occurred. However, abnormality on the outer appearance regarded as abnormal growth of crystal was confirmed. From this, it is thought that it is preferable that the compositional ratio of BT in the composite oxide be less than 30 mol %.

As shown in Table 4, in the Examples 19 to 21, an occurrence of cracks were not confirmed. From this, it was confirmed that an occurrence of cracks was suppressed without depending on the ratio of manganese in the composite oxide of the piezoelectric layer 70.

Other Embodiments

While the embodiment of the invention has been described above, the basic configuration of the invention is not limited to the above description. For example, in the embodiment described above, the single crystal silicon substrate was exemplified as the flow path formation substrate 10. However, the invention is not particularly limited to this, and for example, a material such as an SOI substrate or glass may be used.

In addition, in the embodiment described above, the piezoelectric element 300 in which the first electrode 60, the piezoelectric layer 70, and the second electrode 80 are sequentially laminated on the substrate (flow path formation substrate 10) is exemplified. However, the invention is not limited to this, and for example, the invention can be applied to a vertical vibration type piezoelectric element in which a piezoelectric material and an electrode formation material are alternately laminated so as to be elongated or contracted in the axial direction.

Figure 11:
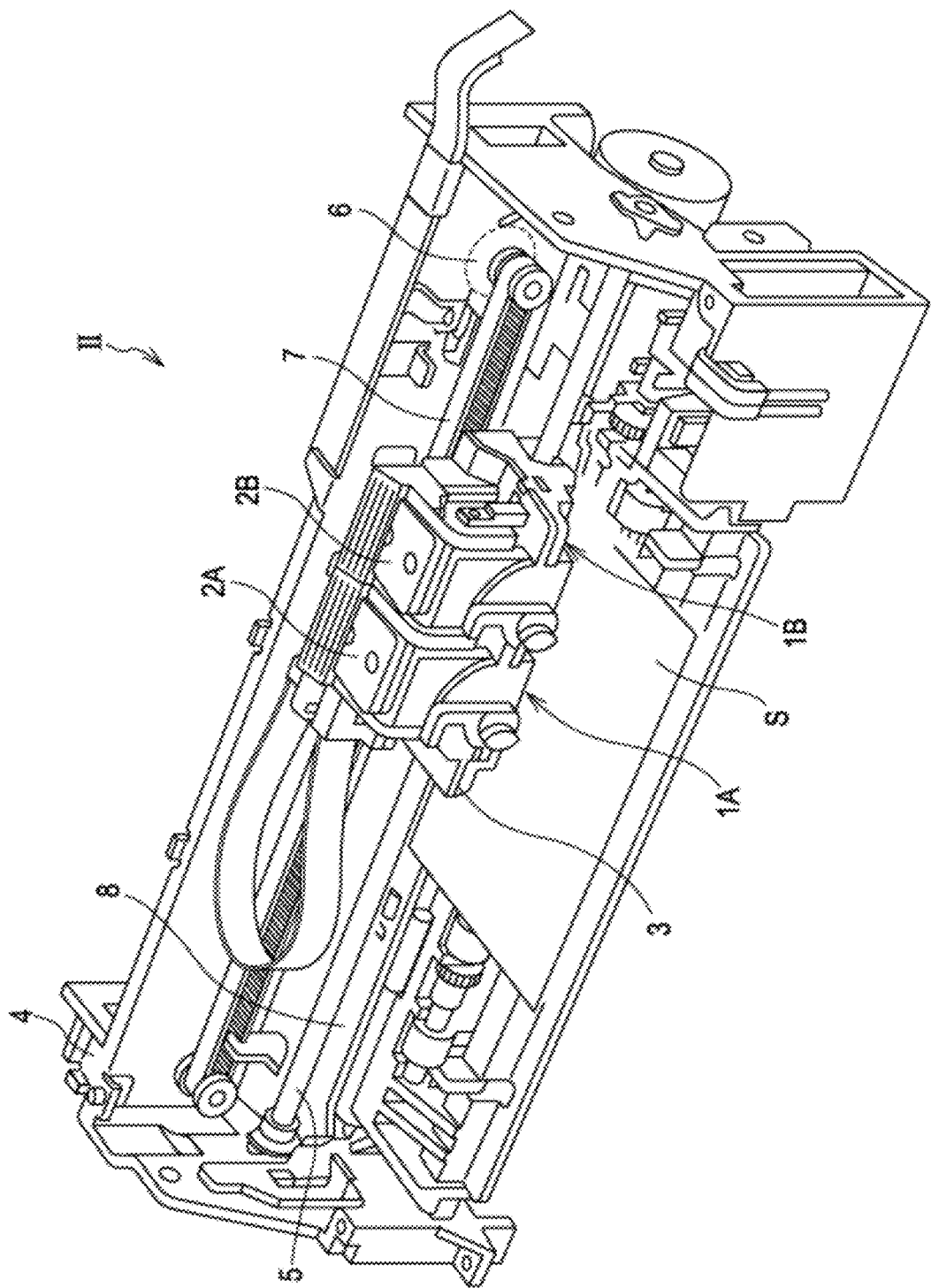
FIG. 11 is a diagram illustrating a simplified configuration of a recording apparatus according to an embodiment of the invention.

In addition, the ink jet recording head of these embodiments constitutes a part of a recording head unit which includes an ink flow path communicating with an ink cartridge or the like and is mounted in the ink jet type recording apparatus. FIG. 11 is a schematic diagram showing an example of the ink jet type recording apparatus.

In the ink jet type recording apparatus II shown in FIG. 11, cartridges 2A and 2B which are used to constitute the ink supply unit are detachably provided in recording head units 1A and 1B having the ink jet type recording head I, and a carriage 3 in which the recording head units 1A and 1B are mounted is provided on a carriage shaft 5 mounted to an apparatus body 4 so as to move in the axial direction. The recording head units 1A and 1B respectively discharge, for example, a black ink composition and a color ink composition.

As a driving force of a driving motor 6 is transmitted to the carriage 3 via a plurality of gears (not shown) and a timing belt 7, the carriage 3 in which the recording head units 1A and 1B are mounted is moved along the carriage shaft 5. On the other hand, a platen 8 is provided in the apparatus body 4 along the carriage shaft 5, and a recording sheet S which is a recording medium such as paper feed by a feed roller (not shown) or the like is wound around the platen 8 so as to be transported.

In the embodiment described above, the ink jet type recording head is described as an example of a liquid ejecting head. However, the invention is widely applied to general liquid ejecting heads, and may also be applied to a liquid ejecting head that ejects a liquid other than ink. As the other liquid ejecting heads, for example, there are various recording heads used in an image recording apparatus such as a printer, a color material ejecting head used for producing a color filter of a liquid crystal display or the like, an electrode material ejecting head used for forming an electrode of an organic EL display, an FED (field emission display), or the like, and a biological organic material ejecting head used for producing biochips.

In addition, the invention is not limited to the piezoelectric element mounted in the liquid ejecting head represented by the ink jet type recording head, and may also be applied to piezoelectric elements of various sensors including an ultrasonic device such as an ultrasonic transducer, an ultrasonic motor, an infrared sensor, an ultrasonic sensor, a thermal sensor, a pressure sensor, a pyroelectric sensor, an acceleration sensor, and a gyro sensor. The invention can also be applied to a ferroelectric element such as a ferroelectric memory, a micro liquid pump, a thin film ceramic capacitor, a gate insulating film, and the like.

What is claimed is:

1. A piezoelectric element comprising:
a piezoelectric layer; and an electrode provided with the piezoelectric layer, wherein the piezoelectric layer is made of a composite oxide containing bismuth ferrite, barium titanate, and bismuth zinc titanate, wherein the composite oxide is represented by the following general expression (1): $_{(1-x-y)}Bi(Fe,Mn)O_3$-$_x$BaTiO$_3$-$_y$Bi(Zn,Ti)O$_3$, ($0.10 \leq x \leq 0.30$, $0.02 \leq y \leq 0.30$).

2. The piezoelectric element according to claim 1, wherein the composite oxide contains 10 mol % or more and 30 mol % or less of the barium titanate, 2 mol % or more and 30 mol % or less of the bismuth zinc titanate, and the remaining amount of the composite oxide after the mol % of barium titanate and bismuth zinc oxide are selected comprises bismuth ferrite.

3. A liquid ejecting head comprising the piezoelectric element according to claim 1.

4. A liquid ejecting apparatus comprising the liquid ejecting head according to claim 3.

5. The piezoelectric element according to claim 1, wherein the bismuth ferrite further contains manganese.

* * * * *